(12) United States Patent
Liu et al.

(10) Patent No.: US 7,554,805 B2
(45) Date of Patent: Jun. 30, 2009

(54) HEAT DISSIPATION STRUCTURE FOR ELECTRONIC DEVICES

(75) Inventors: Chien-Hsiang Liu, Taipei (TW); Fun-Son Yeh, Taipei (TW); Brian Chang, Taipei (TW)

(73) Assignee: Shuttle Inc., Taipei (TW)

( * ) Notice: Subject to any disclaimer, the term of this patent is extended or adjusted under 35 U.S.C. 154(b) by 35 days.

(21) Appl. No.: 11/819,150

(22) Filed: Jun. 25, 2007

(65) Prior Publication Data

US 2008/0316706 A1    Dec. 25, 2008

(51) Int. Cl.
*H05K 7/20* (2006.01)
(52) U.S. Cl. .................. 361/695; 361/690; 361/694; 361/714; 174/16.1; 174/16.3; 165/80.3; 165/104.33
(58) Field of Classification Search .................. 361/690, 361/694, 695, 719; 174/16.1, 16.3; 165/80.3, 165/104.33
See application file for complete search history.

(56) References Cited

U.S. PATENT DOCUMENTS

| | | | |
|---|---|---|---|
| 5,946,192 A * | 8/1999 | Ishigami et al. ............. 361/704 |
| 6,301,115 B1 * | 10/2001 | Hashimoto et al. .......... 361/704 |
| 6,529,375 B2 * | 3/2003 | Miyahara et al. ............ 361/697 |
| 6,749,448 B2 * | 6/2004 | Bright et al. ................ 439/160 |
| 6,816,376 B2 * | 11/2004 | Bright et al. ................ 361/704 |
| 6,836,409 B1 * | 12/2004 | Duxbury et al. ............. 361/704 |
| 6,980,439 B2 * | 12/2005 | Schultz et al. .............. 361/753 |
| 6,999,317 B2 * | 2/2006 | Chengalva et al. .......... 361/715 |
| 7,027,300 B2 * | 4/2006 | Lord .......................... 361/695 |
| 7,254,034 B2 * | 8/2007 | Bolle et al. ................. 361/719 |
| 7,317,617 B2 * | 1/2008 | Meadowcroft et al. ...... 361/715 |
| 7,423,872 B2 * | 9/2008 | Chen .......................... 361/695 |

* cited by examiner

*Primary Examiner*—Boris L Chervinsky
(74) *Attorney, Agent, or Firm*—Muncy, Geissler, Olds & Lowe, PLLC

(57) ABSTRACT

The present invention discloses a heat-dissipation structure for electronic devices, which comprises: a housing having an accommodation space accommodating at least one heat-generating element; a heat conductor arranged in the accommodation space and contacting the heat-generating element; and an electric fan arranged outside the housing. The housing has an opening corresponding to the heat conductor, and the heat conductor extends through the opening and projects from the housing. The electric fan drives an air current to flow through the part of the heat conductor extending through the opening to promote heat-dissipation efficiency.

7 Claims, 3 Drawing Sheets

HEAT DISSIPATION STRUCTURE FOR ELECTRONIC DEVICES

FIELD OF THE INVENTION

The present invention relates to a heat dissipation structure, particularly to a heat dissipation structure, wherein the heat generated by electronic devices is directly conducted to the exterior by a heat conduction element.

BACKGROUND OF THE INVENTION

With the persistently progressive electronic technology, computer science is also widely applied in various fields. The current computer has greatly advanced in function and speed and has been able to process massive and complicated data. In addition to having superior performance, the current computer is also getting slimmer and compacter. Especially, a miniature or vehicular computer usually carries many complicated electronic elements in a very limited space. Operating electronic elements inevitably generate heat, which influences the stability of the system. Thus, heat dissipation technologies are developed to solve such a problem.

Heat dissipation technologies include active cooling technologies and passive cooling technologies. The active cooling technologies utilize external power to drive a cooling device, such as a cooling fan or a cooling water pump. The passive cooling technologies utilize a heat dissipation device made of a heat conduction material, such as heat dissipation fins or heat dissipation pipes, to dissipate heat into air. To achieve a better heat dissipation effect, a single electronic device commonly adopts both active cooling elements and passive cooling elements. For a single electronic device, such a method may really promote heat dissipation efficiency. However, for an electronic apparatus having many electronic devices elaborately arranged, too many heat dissipation elements is unfavorable to miniaturization and compactness. Besides, a plurality of cooling fans operating at high speed generates considerable noise and vibration or even causes internal air turbulence, which may contrarily impair draining heat.

U.S. Pat. No. 7,177,154 and publication No. 2006/0056155 respectively disclosed two computers without using any cooling fan to solve the problems caused by high-speed cooling fans. The former utilizes at least one heat conduction unit to conduct to the housing the heat generated by heat-generating elements. The latter thermally couples the heat-generating elements to heat dissipation plates externally arranged on the housing. As the two conventional technologies mentioned above do not adopt any cooling fan, they can noiselessly lower the interior temperature of a computer. However, the pure passive cooling technologies are limited by the heat conductivity of heat conduction materials. When they are used in an electronic device generating considerable heat or a miniature electronic device, the heat dissipation speed may be smaller than the heat generating speed. Hence, they cannot be extensively applied to all electronic devices.

SUMMARY OF THE INVENTION

The primary objective of the present invention is simplify the structure of heat dissipation devices to meet the dimensions of a miniature or vehicular computer and to solve the conventional problem that too many heat dissipation devices result in low space efficiency and inferior heat dissipation.

To achieve the abovementioned objective, the present invention proposes a heat dissipation structure for electronic devices, which comprises a housing, a heat conductor and an electric fan. The housing further comprises an upper casing and a lower casing, which are joined together to form an accommodation space. The accommodation space accommodates at least one heat-generating element. The heat conductor is also accommodated in the accommodation space and further comprises a heat conduction block contacting the heat-generating element and a plurality of first heat dissipation fins. The housing is made of a heat conduction material and has a plurality of second heat dissipation fins parallel to the first heat dissipation fins. The upper casing has an opening corresponding to the heat conductor, and the first heat dissipation fins of the heat conductor extend through the opening and emerge from the housing. Thus, the heat generated by the heat-generating element can be dissipated to the exterior of the electronic device via the conduction of the heat conductor. The upper casing also has an air suction opening corresponding to the electric fan. The electric fan drains out the hot air inside the accommodation space via the air suction opening and drives the air to flow through the first heat dissipation fins; thus, heat dissipation efficiency is promoted. A cover is arranged over the upper casing and simultaneously spans the opening and the electric fan. The cover cooperates with the upper casing to define an air current tunnel and form an air current outlet. An air current is driven by the electric fan to unidirectionally flow along the air current tunnel and through the heat conductor and then goes out from the air current outlet.

DETAILED DESCRIPTION OF THE PREFERRED EMBODIMENTS

Below, the technical contents of the present invention are described in detail in cooperation with the drawings.

Figure 1:
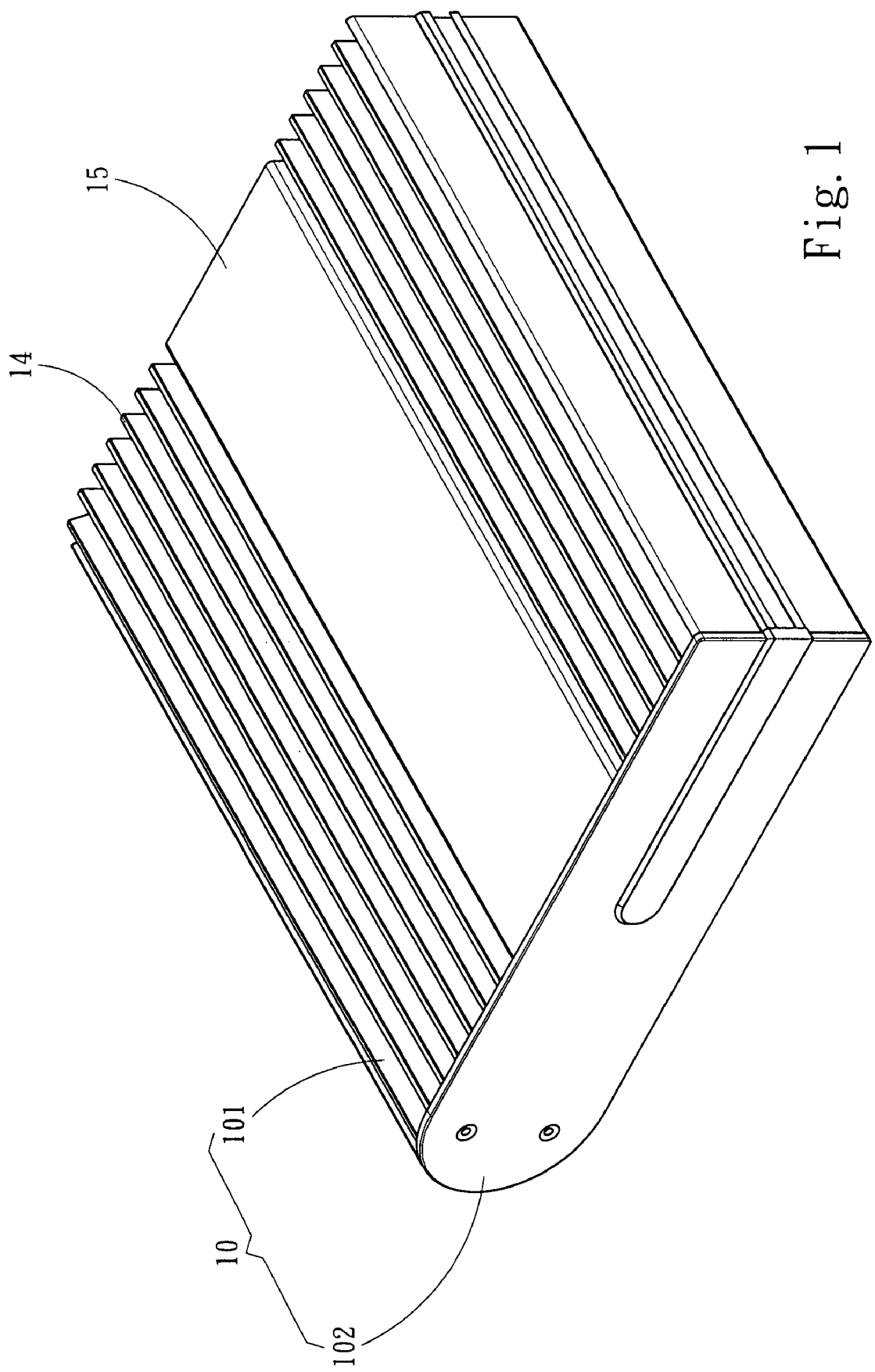
FIG. 1 is a perspective view schematically showing the heat dissipation structure for electronic devices according to one preferred embodiment of the present invention.
Figure 2:
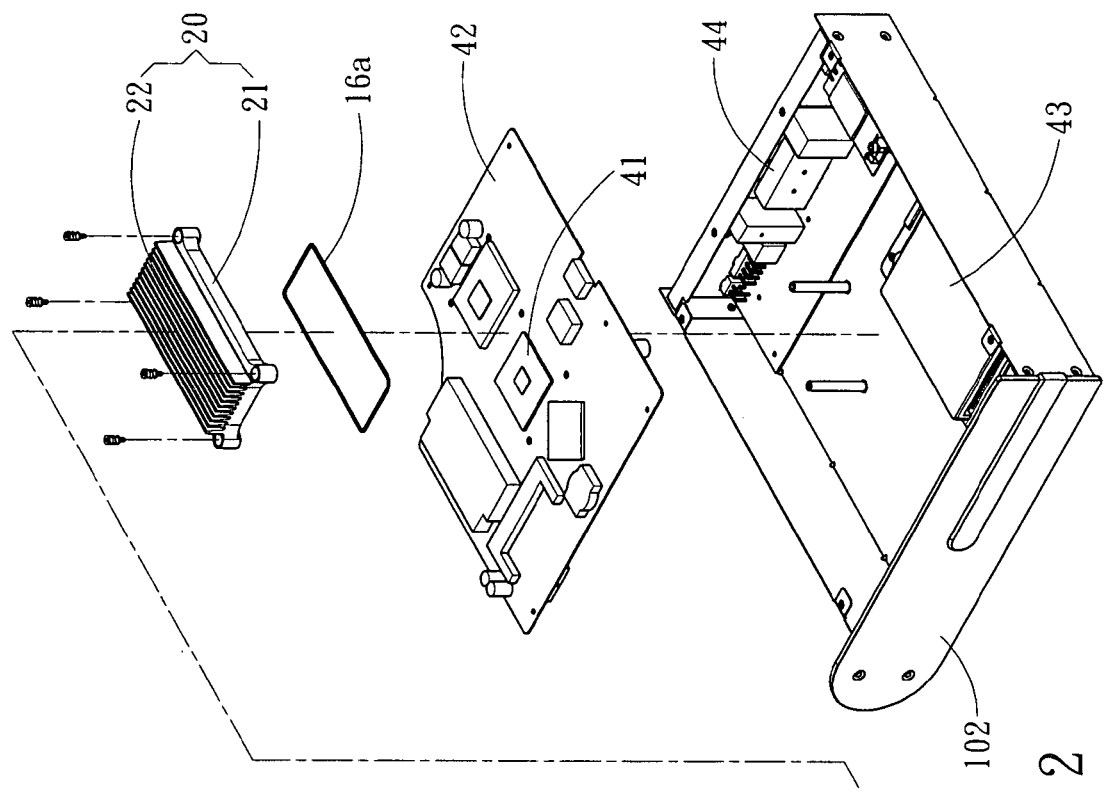
FIG. 2 is an exploded view schematically showing the heat dissipation structure for electronic devices according to one preferred embodiment of the present invention.
Figure 2:
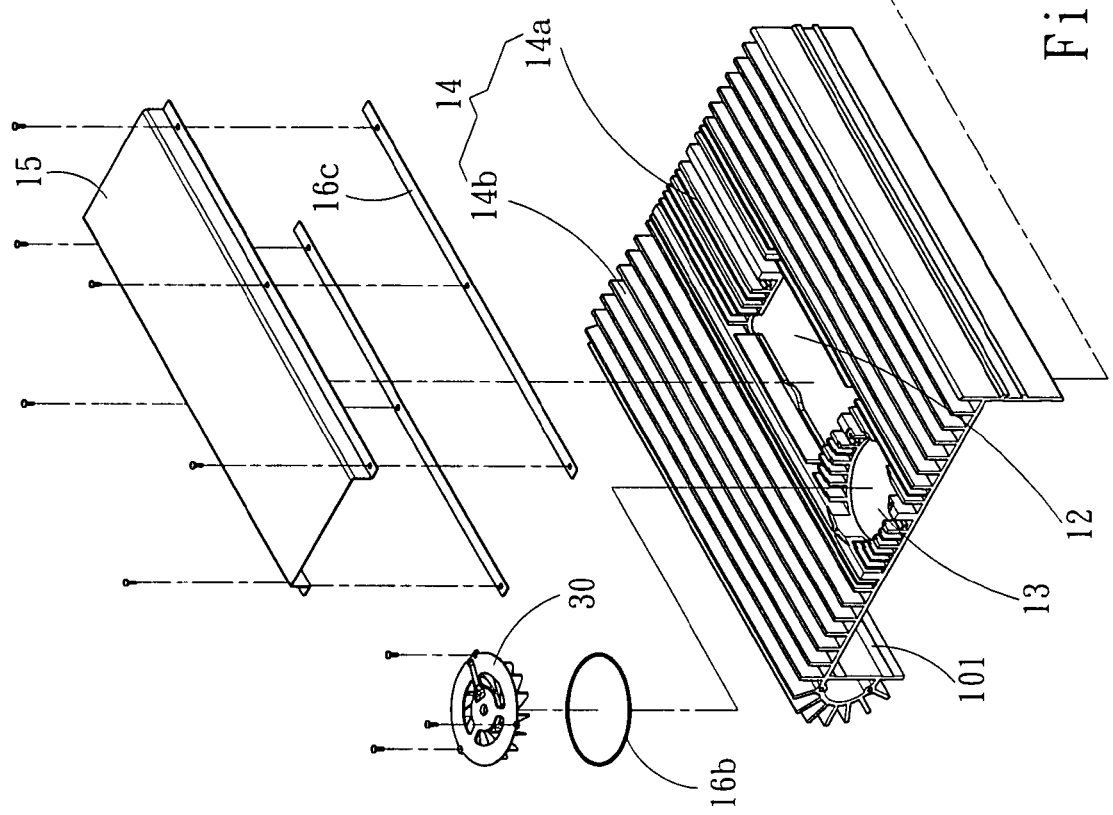
Figure 3:
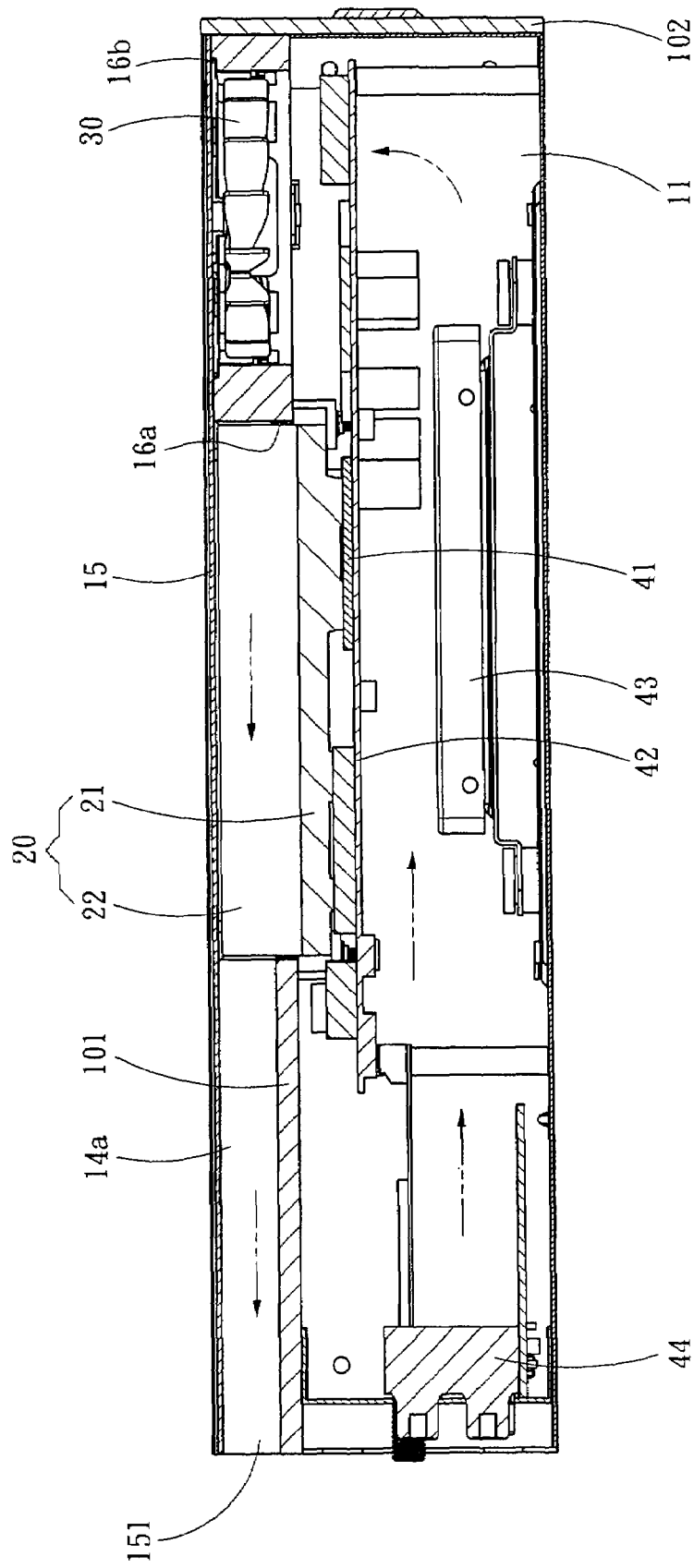
FIG. 3 is a sectional view schematically showing the heat dissipation structure for electronic devices according to one preferred embodiment of the present invention.

Refer to FIG. 1, FIG. 2 and FIG. 3 respectively a perspective view, an exploded view and a sectional view schematically showing one preferred embodiment of the present invention. The present invention is a heat dissipation structure for electronic devices, which comprises: a housing 10, a heat conductor 20 and an electric fan 30. The housing 10 further comprises an upper casing 101 and a lower casing 102, which are joined together to form an accommodation space 11. The accommodation space 11 accommodates at least one heat-generating element, such as CPU 41, a display card, a power supply, etc. (in this embodiment, CPU 41 is used to exemplify the heat-generating element), and other electronic devices, such as a main board 42, a hard drive 43, an I/O interface 44, etc. The heat conductor 20 is also accommodated in the accommodation space 11 and further comprises a heat conduction block 21 contacting CPU 41 and a plurality of first heat dissipation fins 22 receiving heat from the heat conduction block 21. The housing 10 is made of a heat conduction material. When CPU 41 operates and generates heat, the housing 10 can provide a lower-efficiency heat dissipation effect. In the present invention, the housing 10 has an opening 12 corresponding to the heat conductor 20, and a part of the first heat dissipation fins 22 of the heat conductor 20 project through the opening 12 of the upper casing 101. Thereby, the heat generated by CPU 41 is dissipated to the exterior via the conduction of the heat conduction block 21 and the first heat dissipation fins 22. The electric fan 30 is arranged on the upper casing 101 of the housing 10. As the part of the heat conductor 20, which emerges from the housing 10, is within a region which the electric fan 30 drives an air current to flow through, the electric fan 30 can drive an air current to flow through the first heat dissipation fins 22. The upper casing 101 has an air suction opening 13 corresponding to the electric fan 30, and the electric fan 30 drains out the hot air inside the accommodation space 11 via the air suction opening 13. The electric fan 30 not only forcibly drains out the hot air inside the accommodation space 11 but also drives an air current to flow through the heat dissipation fins 22 of the heat conductor 20. Thus, the heat generated by CPU 41 is effectively dissipated, and the heat dissipation efficiency of the entire electronic system is greatly promoted.

A plurality of second heat dissipation fins 14 is arranged on the upper casing 101 of the housing 10 to form a unidirectional air current for the heat conductor 20. The second heat dissipation fins 14a are arranged in the upstream and downstream of the first heat dissipation fins 22, and the second heat dissipation fins 14b are arranged on other places of the surface of the housing 10. A cover 15 made of a heat conduction material is arranged over the upper casing 101 and simultaneously spans the opening 12 of the first heat dissipation fins 22 and the electric fan 30. The cover 15 cooperates with the upper casing 101 to define an air current tunnel and form an air current outlet 151.

An electronic device, such as a vehicular computer, may be used outdoors. To prevent from humidity, waterproof/airtight elements 16a, 16b and 16c are respectively arranged in between the heat conductor 10 and the upper casing 101, between the electric fan 30 and the upper casing 101, and between the cover 15 and the upper casing 101. The waterproof/airtight elements 16a, 16b and 16c may be elastic rubber rings or sealant. In addition to preventing from humidity, the waterproof/airtight elements 16a, 16b and 16c can also prevent air current from leakage and enhance the effect of the unidirectional air current.

Refer to FIG. 3 a diagram schematically showing the directions of the air current, wherein the directions of the air current are indicated by arrows. The hot air generated by electronic devices is sucked into the electric fan 30 via the air suction opening 13; then, the hot air is driven by the electric fan 30 and constrained by the cover 15 and the second heat dissipation fins 14a; thus, the hot air flows along the air current tunnel and forms a unidirectional air current. The air current is driven to flow through the first heat dissipation fins 22 to take away the heat generated by CPU 41; finally, the hot air is drained out from the air current outlet 151.

In the present invention, the heat conductor 20 emerges from the surface of an electronic device to directly dissipate heat. The electric fan 30 cooperates with the air current tunnel to form a unidirectional air current, which takes away the hot air inside the accommodation space 11 and dissipates the heat conducted from CPU 41 to the first heat dissipation fins 22. Thus, the heat dissipation efficiency of an electronic device is greatly promoted with the quantity of electric fans effectively reduced. In addition to efficiently dissipating heat, the present invention can also overcome the conventional problems that too many electric fans induce noise and vibration, and that unregulated air current causes the retention of hot air. Therefore, the present invention indeed possesses novelty and non-obviousness and meets the requirements of a patent. Thus, the Inventor files the application for a patent. It is greatly appreciated if the patent is approved fast.

Those described above are only the preferred embodiments of the present invention but not intended to limit the scope of the present invention. Any equivalent modification or variation according to the spirit of the present invention is to be also included within the scope of the present invention.

What is claimed is:

1. A heat-dissipation structure for electronic devices comprising:
   a housing having an accommodation space accommodating at least one heat-generating element;
   a heat conductor arranged in said accommodation space, contacting said heat-generating element and conducting heat generated by said heat-generating element; and
   an electric fan arranged outside said housing,
   wherein said housing has an opening corresponding to said heat conductor, and a part of said heat conductor extends through said opening to emerge from said housing and is within a region which said electric fan drives an air current to flow through; said air current can externally dissipate heat fast from said part of said heat conductor and promote heat-dissipation efficiency; and
   wherein said housing has an air suction opening corresponding to said electric fan.

2. The heal-dissipation structure for electronic devices according to claim 1, wherein a waterproof/airtight element is arranged in between said electric fan and said housing.

3. The heat-dissipation structure for electronic devices according to claim 1, wherein said heat conductor further comprises a heat conduction block contacting said heat-generating element and a plurality of first heat dissipation fins projecting from said opening of said housing.

4. The heat-dissipation structure for electronic devices according to claim 3, wherein said housing has a plurality of second heat dissipation fins parallel to said first heat dissipation fins.

5. The heat-dissipation structure for electronic devices according to claim 1, wherein a cover is arranged over said housing and simultaneously spans said opening and said electric fan; said cover cooperates with said housing to define an air current tunnel and form an air current outlet.

6. The heat-dissipation structure for electronic devices according to claim 5, wherein a waterproof/airtight element is arranged in between said cover and said housing.

7. The heat-dissipation structure for electronic devices according to claim 1, wherein a waterproof/airtight element is arranged in between said heat conductor and said housing.

* * * * *